Sept. 6, 1966 C. G. ELLIOTT 3,271,507

FLAT PACKAGE FOR SEMICONDUCTORS

Filed Nov. 2, 1965 2 Sheets-Sheet 1

INVENTOR
Charles G. Elliott
BY Marn & Jangarathis
ATTORNEYS

INVENTOR
Charles G. Elliott
BY Marn & Jangarathis
ATTORNEYS

United States Patent Office 3,271,507

Patented Sept. 6, 1966

3,271,507

FLAT PACKAGE FOR SEMICONDUCTORS

Charles G. Elliott, Setauket, N.Y., assignor to Alloys Unlimited, Inc., Melville, N.Y.

Filed Nov. 2, 1965, Ser. No. 506,030

10 Claims. (Cl. 174—52)

This invention relates generally to structures or packages on which small semiconductor elements are mounted and, more particularly, the invention relates to semiconductor packages in which all circuit connections to terminals are enclosed within the package, with only the terminals exposed. The novel package of the invention is preferably mounted terminal-side down, i.e. inverted, on a circuit board with the etrminals in direct contact with other circuit elements or conductors.

The very small size of semiconductor elements makes the connection of wires thereto, referred to as ohmic contact, a difficult task. For example, networks which are complete circuit configurations are fabricated from a single semiconductor wafer, the various elements such as resistances, capacitances and amplifying devices being formed by making ohmic contact at appropriate places. Thus, the semiconductive material between two ohmic contacts on the wafer may constitute a resistance, while the capacitance existing within a back-biased PN junction may be employed as a capacitive element. Dual junctions, i.e. PNP and NPN junctions, may be used to form transistor amplifying elements. Often, the surface of the wafer is etched in various configurations to form desired circuit components. When it is considered that the wafer may be no bigger than the head of a pin and only 0.020 in. thick, the magntitude of handling and assembly problems becomes apparent.

Typically, these problems are minimized by attaching each wafer to a ceramic substrate or support which is sufficiently thick to resist breakage during handling. Special cements have been developed which can withstand the subsequent treatment and service conditions, which may include operation at up to 400° C. After the appropriate ohmic contacts have been made and terminal wires attached, it is common to hermetically seal the entire device with an appropriate potting compound, such as epoxy.

While literally hundreds of packages have been designed to meet particular needs, it will be sufficient herein to describe one particular design which is closely related to the present invention. The present invention is, in fact, a very substantial improvement on this design. The ceramic substrate of this package is a small (0.06 x 0.06 x 0.020 in.) wafer having a central channel between two raised end sections on one surface. The channel, 0.006 in. deep, is relatively broad, occupying about three-fourths of the width of the wafer. In its simplest embodiment, all horizontal top surfaces of the wafer are coated with a conductive material, gold being preferred. Thus, the bottom of the channel and the top surface of the two end sections which define the channel are gold plated. The vertical surfaces therebetween are not plated. (As used herein, the term "plated" refers to any kind of metallized coating process, of which there are many.)

The semiconductive wafer is placed in the channel and bonded to the gold surface, thereby making ohmic contact. If only one contact with each surface is desired, a wire is attached to the top surface of the semiconductor and to one of the raised end-section surfaces, and another wire is attached to the still-exposed portion of the gold in the bottom of the channel and attached to the other end-section surface. The end section surfaces form the terminals and the entire channel section is potted with epoxy. More commonly, two contacts are desired on the top surface of the semiconductor with one contact on the bottom (the normal transistor configuration), in which case the top surface contacts are connected to the end surfaces and a wire leading out of the structure is attached to the channel bottom. In either instance the completed assembly is mounted channel-side up on the circuit board, necessitating wire connections to the terminal surfaces, because of the internal wire connections on the terminal surfaces.

It is a general object of the present invention to provide an improved package for semiconductive elements.

Another object of the present invention is to provide a semiconductor package mountable in the inverted position.

Still another object of the invention is to provide a flat semiconductor package having no wires protruding therefrom.

Yet another object of the invention is to provide a versatile, flat semiconductor package suitable for a plurality of ohmic contact arrangements.

Various other objects and advantages of the invention will become clear from the following description of several embodiments thereof, and the novel features will be particularly pointed out in connection with the appended claims.

In essence, the present invention is an improvement over the package described hereinabove, differing from that package in two distinct features which may be used independently or jointly. Firstly, a "step" section of intermediate height is formed between the bottom of the channel and the end section along one or both sides. For convenience, this step section may be said to have a riser surface and a tread surface. Gold plating (or other conductive metal plating) is applied to all vertical and horizontal surfaces except the riser surface. Instead of making ohmic contact with the top surface of the end section, it is made on the tread surface of the step section. After the device is potted, the top surface of the end section is free of any wires, the package is flat, and may be mounted with the terminal side against the circuit board.

The second significant difference embodied in the present invention involves the use of grooves of varying depth which may be cut through the end section, the channel sections or both. The function of these grooves is to multiply the number of ohmic contacts which may be made to both top and bottom surfaces of the semiconductive wafer.

Understanding of the invention will be facilitated by referring to the following detailed description thereof in conjunction with the accompanying drawings, in which.

Figure 1:
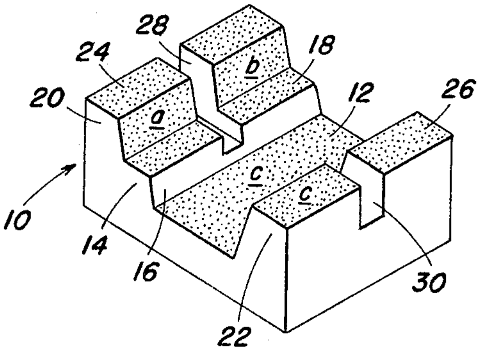
FIGURES 1–5 are perspective views of five embodiments of the invention.

FIGURE 1 illustrates both of the above-described features of the invention. The ceramic substrate, indicated generally at 10, is seen to comprise a channel section 12, a step section 14 having riser surface 16 and tread surface 18, and two end section 20, 22 with top surfaces 24, 26. A conductive coating, preferably gold, is applied to all surfaces except riser surface 16. Two grooves 28, 30 are cut in the end and step sections down to a depth intermediate between the channel and tread surfaces. Grooves 28 and 30, as can be seen from the drawing, bisect the end and step sections and, together with riser section 16, form three distinct areas of conductive metal plating, labelled *a*, *b* and *c*. Area *a* covers part of the tread surface 18 and the top and side surfaces of end section 20. Area *b* covers the same area on the other side of groove 28, and area *c* covers the bottom of channel 12 and the inside and top surfaces of end section 22. A semiconductive wafer bonded to channel 12 thus has the bonded surface in ohmic contact with both halves of top surface 26. Two ohmic contacts can be made to the top surface of the semiconductive wafer, one going to tread surface 18*a* and one to tread surface 18*b*. As the plating is continuous, top surfaces 24*a* and 24*b* form the terminals.

Figure 2:
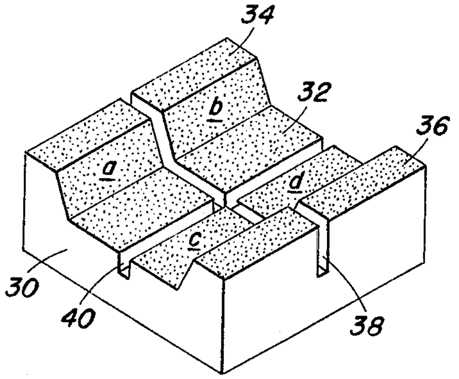

FIGURE 2 illustrates an embodiment of the invention utilizing only the groove feature of the invention. Substrate 30 has a channel section 32 and two raised end sections 34, 36. Plating is applied over the entire top surface. A first groove 38 is cut transverse to the channel to a depth below that of the channel, thus bisecting end sections 34, 36. A second groove 40 bisects the channel lengthwise and extends to the same depth. The effect of these two grooves is to form four discrete conducting areas *a, b, c, d*. A semiconductive wafer bonded in the center of the channel thus has its lower surface in ohmic contact with all four top surfaces (34*a*, 34*b*, 36*c* and 36*d*).

Figure 3:
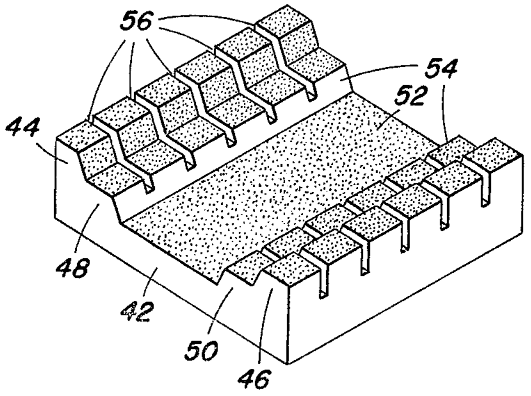
Figure 4:
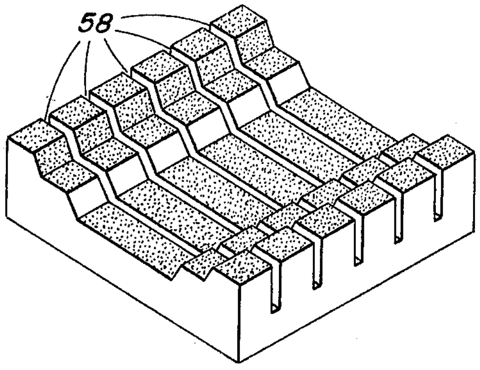
Figure 5:
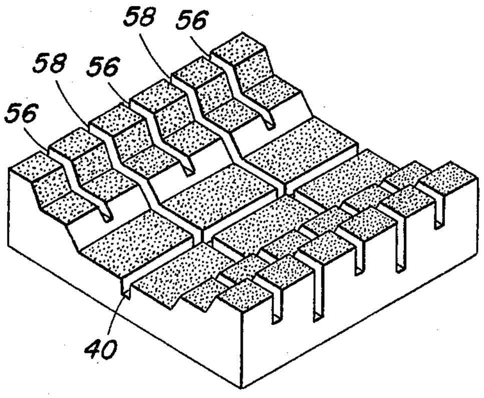

The embodiments of FIGURES 3, 4 and 5 have the same basic structure but different configurations of grooves. The substrate 42 has two raised end sections 44, 46, two step sections 48, 50 and a central channel section 52. Conductive plating is applied over all horizontal and vertical surfaces except riser surfaces 54. In FIGURE 3, the grooves 56 are similar to groove 28 of FIGURE 1, but five parallel grooves are cut, thus forming 12 discrete terminal surfaces. Ohmic contacts are made from either the channel surface or the top of the semiconductive wafer to the various tread surfaces. One or a plurality of semiconductive wafers can be bonded to channel surface 52.

The embodiment of FIGURE 4 differs from FIGURE 3 only in that grooves 58 are cut deeper, to a depth below that of the channel, so that six discrete areas are formed on the channel surface. Ohmic contact is made from the channel surface and the semiconductor top surface to the various tread surfaces, as noted above.

FIGURE 5 has two deep grooves 58 as in FIGURE 4, three shallow grooves 56 as in FIGURE 3, and a single groove 40 bisecting the channel lengthwise as in FIGURE 2. The channel surface is again divided into six discrete areas and there are twelve terminal surfaces. Ohmic contacts are made as described above.

Figure 6:
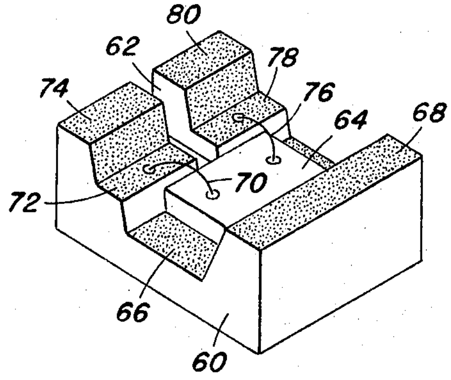
FIGURE 6 is a perspective view of an embodiment similar to FIGURE 1 with the semiconductive wafer and ohmic contacts in place.
Figure 7:
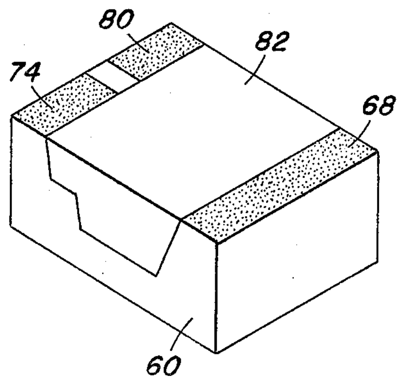
FIGURE 7 is a perspective view of the embodiment of FIGURE 6 after potting, i.e. the complete assembly.

FIGURE 6 illustrates a typical transistor package, with the semiconductor wafer and ohmic contacts in place. The substrate 60 is similar to that shown in FIGURE 1 except the groove 62 is cut only on one side. The base contact is formed by bonding the semiconductor wafer 64 to the plated bottom of channel 66. The base terminal is thus top end surface 68. An emitter contact is formed by attaching wire 70 to wafer 64 and plated tread surface 72, so top surface 74 froms the emitter terminal. In a similar fashion wire 76 is attached to wafer 64 and plated tread surface 78 so that top surface 80 is the collector terminal. The assembly of FIGURE 6 is ready for potting, and the finished product is illustrated in FIGURE 7. The entire channel section is filled with epoxy 82 or any suitable potting compound, leaving terminals 68, 74 and 80 exposed. As can be seen in FIGURE 7, the complete package is flat, i.e. there are no exposed wires, and it is suitable for mounting terminal-side down.

Figure 8:
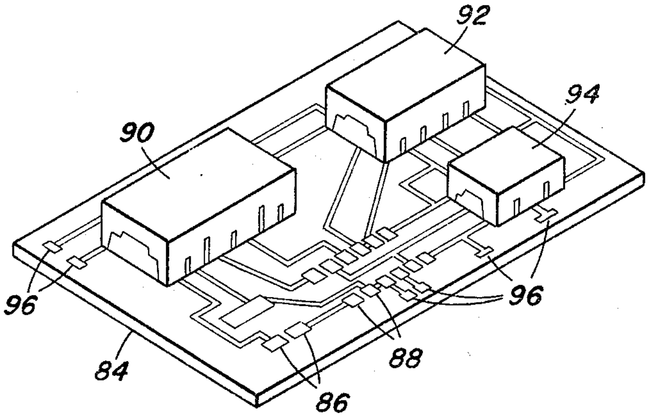
FIGURE 8 is a perspective view of a partially assembled circuit board for use in conjunction with the invention.

The advantages of inverted mounting are obvious from FIGURE 8, which shows a circuit board 84 designed for five of the above described packages, of which three are shown already mounted. The circuit is entirely printed, with terminal surfaces 86, 88 printed to correspond to the terminal surfaces of the packages. The completely assembled packages 90, 92, 94 are bonded directly to the printed terminals, thus forming wire-less circuits of high dependability. Exterior connections to board 84 are made at terminals 96. A five-element board as pictured in FIGURE 8 measures approximately one-half inch by one-quarter inch.

While the procedures for manufacturing the packages form no part of the present invention, their extremely small size requires that certain materials and techniques be used for best results. A variety of ceramic materials can be used to form the substrates, but high purity alpha alumina is the material of choice. It is necessary that a suitable grain-size distribution of the alumina particles be obtained, so that the packages will be sufficiently dense. The blend ranges from —48 mesh to —325 mesh. The sized particles are mixed with water and suitable binders, and formed into elongated blanks having the cross-section of the finished package. The forming operation is generally done on presses with hard-finished dies, but extrusion is also possible.

The next two operations are metallizing and firing, and there are known techniques for performing either operation first (i.e. metallizing can be done with the substrate in the green or fired state). Metallizing can be done in a variety of ways. Spraying of the metal from a suspension with a volatile liquid carrier is preferred. For spraying, a large number of blanks are close-packed in a tray and the entire top surface is sprayed, the close packing preventing any metallizing from depositing on the sides of the blank. After drying, the operation can be repeated as necessary. Firing is carried out in a suitable kiln using well-known techniques.

After firing and metallizing, the metallizing is removed from surfaces where it is not desired, i.e. the riser surface of the step sections. The blanks are now ready to be grooved and cut into individual packages.

Diamond wheels are necessary to cut the fired ceramic. Gangs of such wheels, appropriately spaced and at a set height, do the grooving. The blanks are close packed, side by side, on an open-ended tray and passed beneath the wheels. If a groove is to be cut along the length of the channel section a second operation is necessary. A similar gang of wheels cuts the blank into individual packages. Finally, the packages are gold plated, the gold of course adhering only to the metallized surfaces.

The assembly of the semiconductor elements, bonding, making ohmic contact and potting, are all well known procedures which need not be described herein. It should be pointed out, however, that as used herein, the term "bonding" refers to electrical as well as physical bonding, and not just cementing, as the term is often employed.

It is to be understood that various changes in the details, steps, materials and arrangements of parts, which have herein been described and illustrated in order to explain the nature of the invention, may be made by those skilled in the art within the principle and scope of the invention as described in the appended claims.

What is claimed is:

1. A package structure for containing semiconductor elements comprising:

an insulating ceramic substrate having on one surface a channel section between first and second raised end sections;

a step section between said channel section and said first end section along the entire length thereof and having a riser surface adjacent said channel surface and a tread surface adjacent said first end section;

a first continuous conductive coating covering said tread surface, the top surface of said first end section, and the surface therebetween; and a second continuous conductive coating covering said channel surface, the top surface of said second end section, and the surface therebetween.

2. The structure as claimed in claim 1, and additionally comprising at least one groove across said first end section and said step section, said groove extending below said tread surface and forming a plurality of discrete conductively coated areas.

3. The structure as claimed in claim 1, and additionally comprising a groove bisecting said channel section lengthwise, said groove extending below the surface of said channel and forming two discrete conductively coated areas from said second coating.

4. The structure as claimed in claim 1, and additionally comprising at least one groove across said first and second end sections and said step section, said groove extending below said tread surface and forming a plurality of discrete, conductively coated areas.

5. The structure as claimed in claim 4, wherein said groove extends to a depth below said channel surface.

6. A package structure for containing semiconductor elements comprising an insulating ceramic substrate having on one surface a channel section, two raised step sections along either side of said channel section and two raised end sections adjacent said step sections, said sections defining a channel surface, riser and tread surfaces on said step sections and side and top surfaces on said end sections;

a continuous conductive coating on said channel surface; and continuous conductive coatings on each said tread surface, side surface and top surface.

7. The structure as claimed in claim 6, and additionally comprising at least one transverse groove through said end and step sections and extending below said tread surface.

8. The structure as claimed in claim 7, wherein said groove extends below said channel surface.

9. A package structure for containing semiconductor elements comprising:

an insulating ceramic substrate having on one surface two raised end sections defining a central channel section;

a continuous conductive coating over said channel section and the adjoining side and top surfaces of said end sections;

a first groove cut across said end sections and channel section and extending below the surface of said channel section;

a second groove bisecting said channel section lengthwise and extending below the surface of said channel section;

said grooves defining four discrete, conductively coated areas.

10. A semiconductor package assembly comprising an insulating ceramic substrate having on the top surface thereof a channel section between two raised end sections and a step section of intermediate height between said channel section and one of said end sections, said step section having a riser surface and a tread surface;

a conductive coating over the entire top surface of said substrate except said riser surface;

a groove cut in said step section and adjoining end section and extending below said tread surface, said groove and riser surface defining two discrete coated areas;

a semiconductive wafer bonded to said channel section and in ohmic contact with said coating therein;

a second ohmic contact between the top surface of said wafer and said tread surface; and an insulating potting compound filling said channel section and said groove.

References Cited by the Applicant

UNITED STATES PATENTS

| | | |
|---|---|---|
| 2,875,385 | 2/1959 | Fuller. |
| 3,072,832 | 1/1963 | Kilby. |
| 3,073,006 | 1/1963 | New. |
| 3,231,797 | 1/1966 | Koch. |

LEWIS H. MYERS, *Primary Examiner.*

DARRELL L. CLAY, *Examiner.*